(12) United States Patent
Sutardja

(10) Patent No.: US 7,884,677 B2
(45) Date of Patent: Feb. 8, 2011

(54) METHOD AND APPARATUS FOR REDUCING PHASE NOISE IN AN OSCILLATOR SIGNAL OF A COLPITTS OSCILLATOR

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 13 days.

(21) Appl. No.: 12/104,050

(22) Filed: Apr. 16, 2008

(65) Prior Publication Data

US 2008/0258828 A1 Oct. 23, 2008

Related U.S. Application Data

(60) Provisional application No. 60/912,837, filed on Apr. 19, 2007, provisional application No. 60/941,085, filed on May 31, 2007.

(51) Int. Cl.
*H03B 5/12* (2006.01)
(52) U.S. Cl. .................... 331/117 FE; 331/185
(58) Field of Classification Search ........... 331/117 FE, 331/117 R, 185, 167, 186
See application file for complete search history.

(56) References Cited

U.S. PATENT DOCUMENTS

| 5,717,241 | A | 2/1998 | Malhi et al. | |
|---|---|---|---|---|
| 5,900,788 | A | 5/1999 | Hagemeyer | |
| 6,750,726 | B1 * | 6/2004 | Hung et al. | 331/100 |
| 7,012,487 | B2 * | 3/2006 | Allott | 333/214 |
| 7,365,612 | B2 * | 4/2008 | Rohde et al. | 331/107 SL |
| 7,414,488 | B2 * | 8/2008 | Lee et al. | 331/167 |
| 2006/0279368 | A1 * | 12/2006 | Rohde et al. | 331/167 |

FOREIGN PATENT DOCUMENTS

GB 2225502 A 5/1990

OTHER PUBLICATIONS

Balanced Colpitt Oscillator MMICs Designed for Ultra-Low Phase Noise; Herbert Zirath et al.; IEEE Journal of Solid-State Circuits, vol. 40, No. 10; Oct. 2005; 10 pages.
Yi Lin et al: "Fully integrated 5GHz CMOS VCOs with on chip low frequency feedback circuit for 1/f induced phase noise suppression"; Solid-State Circuits Conference, 2002. ESSCIRC 2002. Proceedings of the 28TH European Florence, Italy Sep. 24-26, 2002, Piscataway, NJ, USA, IEEE, Sep. 24, 2002, pp. 551-554, XP010823953, ISBN: 978-88-900847-9-9, Sections 2, 3.3, 3.4 and 5, firgures 1, 2a.
Roberto Aparicio et al: "A Noise-Shifting Differential Colpitts VCO"; IEEE Service Center, Piscataway, NJ, US vol. 37, No. 12, Dec. 1, 2002, XP011065889, ISSN: 0018-9200, figure 4a.
Chung Ming Yuen et al.: "Low voltage circuit design techniques for voltage controlled oscillator" Control of Oscillations and Chaos, 1997. Proceedings., 1997 1st International Conference St. Petersburg, Russia Aug. 27-29, 1997, New York, NY, USA, IEEE, US, vol. 3, Aug. 27, 1997, pp. 561-564, XP010250673, ISBN: 978-0-7803-4247-7, p. 564, left-hand column; figure 5.

(Continued)

*Primary Examiner*—Robert Pascal
*Assistant Examiner*—Levi Gannon

(57) ABSTRACT

A Colpitts oscillator includes a tank circuit, a first transistor, and a first feedback circuit. The first transistor includes a first region, a second region, and a control region. The first region communicates with the tank circuit. The first feedback circuit communicates with the second region and the control region of the first transistor.

7 Claims, 11 Drawing Sheets

OTHER PUBLICATIONS

The International Search Report and the Written Opinion of the International Searching Authority, or the Declaration mailed Sep. 5, 2009 for International Application No. PCT/US2008/060765 filed Apr. 18, 2008; 15 pages.

* cited by examiner

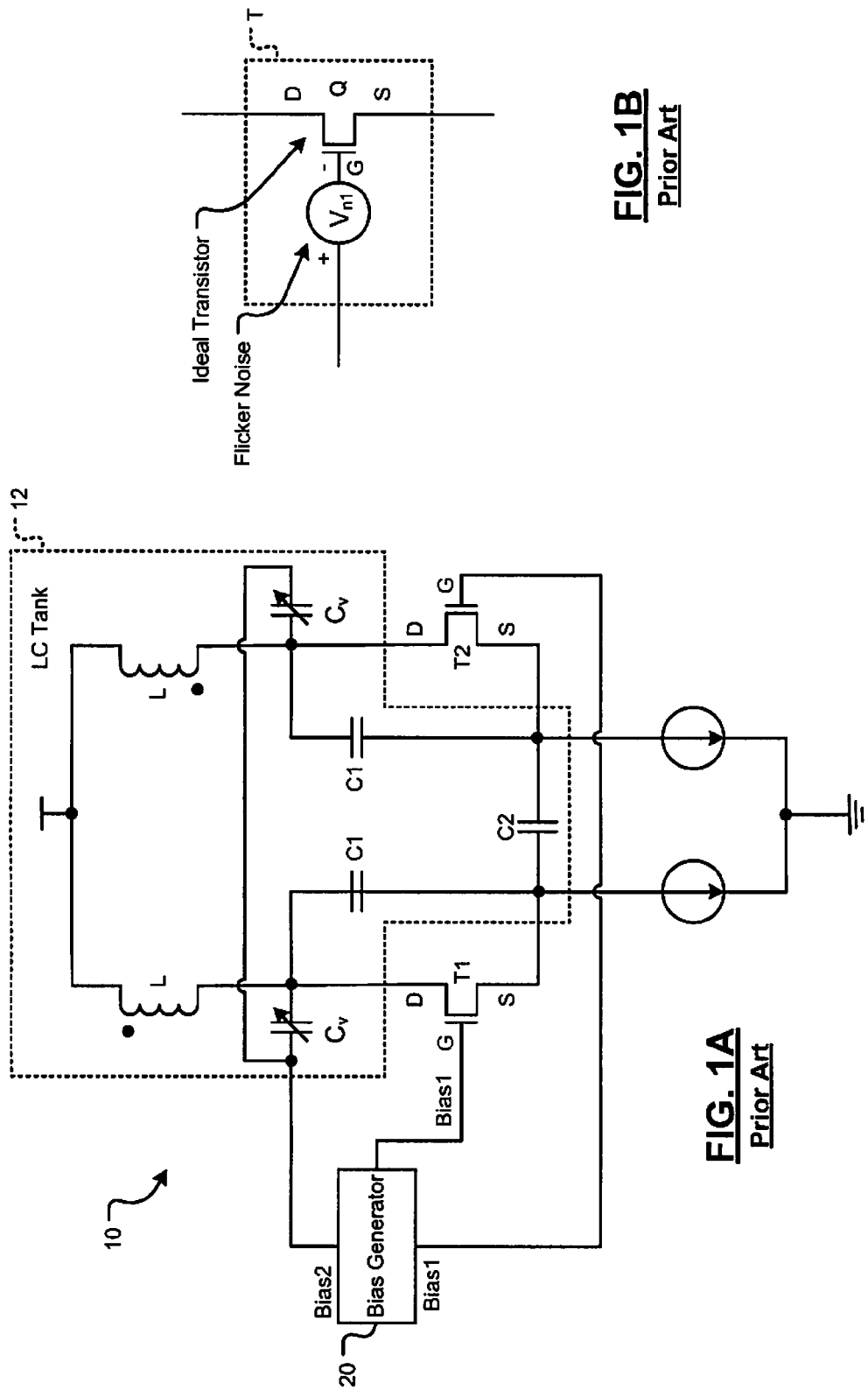

METHOD AND APPARATUS FOR REDUCING PHASE NOISE IN AN OSCILLATOR SIGNAL OF A COLPITTS OSCILLATOR

CROSS-REFERENCE TO RELATED APPLICATIONS

This application claims the benefit of U.S. Provisional Application No. 60/941,085 filed on May 31, 2007 and U.S. Provisional Application No. 60/912,837 filed on Apr. 19, 2007. The disclosures of the above applications are incorporated herein by reference in their entirety.

FIELD

The present disclosure relates to oscillator circuits.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIGS. 1A-1B, a Colpitts oscillator (hereinafter oscillator) 10 is shown. In FIG. 1A, the oscillator 10 comprises transistors T1 and T2 and a LC tank circuit 12. The LC tank circuit 12 includes inductances L, capacitances C1 and C2, and variable capacitances (varactors) $C_v$ that may be included for tuning. A bias generator 20 generates biasing signals that bias the transistors T1 and T2 and the LC tank circuit 12. A frequency of an oscillator signal generated by the oscillator 10 is given by the following equation:

$$f = 1/2\pi \sqrt{L * \frac{C1C2}{C1+C2}}$$

The transistors T1 and T2 may include metal oxide semiconductor (MOS) transistors or bipolar junction transistors (BJTs). Flicker noise (also called phase noise) generated by the transistors T1 and T2 may be present in the oscillator signal. In FIG. 1B, a transistor (which can include transistors T1 or T2) is shown to comprise a source of flicker noise $V_{n1}$ in series with gate G of ideal transistor Q.

The frequency and/or amplitude of the flicker noise $V_{n1}$ may be less than the frequency and/or amplitude of the oscillator signal, respectively. The amount of flicker noise present in the oscillator signal may depend on the type of transistors used to implement the oscillator 10. For example, MOS transistors may generate a larger flicker noise than BJTs.

SUMMARY

A Colpitts oscillator comprises a tank circuit, a first transistor, and a first feedback circuit. The first transistor includes a first region, a second region, and a control region. The first region communicates with the tank circuit. The first feedback circuit communicates with the second and control regions.

In another feature, the first feedback circuit comprises an active gain stage and a passive filter. The active gain stage is coupled to the passive filter. The control region is coupled to the active gain stage and the second region is coupled to the passive filter. The passive filter includes a first low-pass filter (LPF), and the active gain stage includes a first amplifier. The first feedback circuit further comprises a first capacitance. The first LPF communicates with the second region, receives a signal having oscillator and noise components, filters the oscillator component, and passes the noise component to an output. The first amplifier communicates with the output and has an output that communicates with the control region. The first capacitance communicates with the output of the first amplifier and generates a dominant pole at a frequency of the noise component.

In another feature, the Colpitts oscillator further comprises a second transistor and a second feedback circuit. The second transistor includes a first region, a second region, and a control region. The first region of the second transistor communicates with the tank circuit. The second feedback circuit communicates with the second and control regions of the second transistor.

In another feature, the second feedback circuit comprises a second LPF, a second amplifier, and a second capacitance. The second LPF communicates with the second region of the second transistor, receives the signal, filters the oscillator component, and passes the noise component to an output. The second amplifier communicates with the output of the second LPF and has an output that communicates with the control region of the second transistor. The second capacitance communicates with the output of the second amplifier and generates the dominant pole.

In another feature, each of the first and second transistors includes a metal oxide semiconductor (MOS) transistor. The first, second, and control regions include drain, source, and gate regions, respectively.

In another feature, each of the first and second LPFs comprises a RC circuit.

In another feature, each of the first and second LPFs comprises an $N^{th}$ order filter, where N is an integer greater than 1.

In another feature, each of the first and second amplifiers comprises a low-frequency transconductance amplifier having a negative gain.

In another feature, the Colpitts oscillator further comprises a bias generator that is coupled to the tank circuit.

In other features, the first amplifier comprises a bipolar junction transistor (BJT). The BJT comprises a parasitic NPN BJT. The BJT is selected from a group consisting of vertical parasitic BJT and lateral parasitic BJT.

In other features, the first amplifier comprises a MOS transistor having a gate area that is greater than a gate area of the first transistor. The first amplifier comprises a MOS transistor having a gate area that is five times greater than a gate area of the first transistor. The first amplifier comprises a MOS transistor having a gate area that is ten times greater than a gate area of the first transistor. The first amplifier comprises a MOS transistor having a gate area that is twenty times greater than a gate area of the first transistor. The first amplifier comprises a MOS transistor having a gate area that is fifty times greater than a gate area of the first transistor. The first LPF comprises a resistance and a transistor having a control terminal that communicates with the resistance and first and second terminals connected together. The first LPF comprises a distributed resistance/capacitance (RC) circuit.

In still other features, a Colpitts oscillator comprises a tank circuit, first and second metal oxide semiconductor (MOS) transistors, and a bias generator. The first MOS transistor is coupled to the tank circuit and includes a bulk, source, gate, and drain, wherein the bulk is connected to the source. The second MOS transistor communicates with the tank circuit and includes a bulk, source, gate, and drain, wherein the bulk of the second MOS transistor is connected to the source of the second MOS transistor. The bias generator is coupled to the tank circuit and to the gates of the first and second MOS transistors.

In another feature, each of the first and second MOS transistors includes a deep N well region.

In another feature, the tank circuit comprises first and second inductances, first and second capacitances, and a third capacitance. The first and second inductances have first nodes that communicate with a voltage source and second nodes that communicate with the drains of the first and second MOS transistors, respectively. The first and second capacitances have first nodes that communicate with the second nodes of the first and second inductances, respectively, and second nodes that communicate with the sources of the first and second MOS transistors, respectively. The third capacitance has first and second nodes that communicate with the second nodes of the first and second capacitances, respectively.

In still other features, a Colpitts oscillator comprises a tank circuit, a first metal oxide semiconductor (MOS) transistor, and a first feedback circuit. The first MOS transistor is coupled to the tank circuit and includes a bulk, source, gate, and drain, wherein the bulk is connected to the source. The first feedback circuit communicates with the source and the gate.

In another feature, the first feedback circuit comprises a first low-pass filter (LPF), a first amplifier, and a first capacitance. The first LPF communicates with the source, receives a signal having oscillator and noise components, filters the oscillator component, and passes the noise component to an output. The first amplifier communicates with the output and has an output that communicates with the gate. The first capacitance communicates with the output of the first amplifier and generates a dominant pole at a frequency of the noise component.

In another feature, the Colpitts oscillator further comprises a second MOS transistor and a second feedback circuit. The second MOS transistor is coupled to the tank circuit and includes a bulk, source, gate, and drain, wherein the bulk of the second MOS transistor is connected to the source of the second MOS transistor. The second feedback circuit communicates with the source and the gate of the second MOS transistor.

In another feature, the second feedback circuit comprises a second LPF, a second amplifier, and a second capacitance. The second LPF communicates with the source of the second MOS transistor, receives the signal, filters the oscillator component, and passes the noise component to an output. The second amplifier communicates with the output of the second LPF and has an output that communicates with the gate of the second MOS transistor. The second capacitance communicates with the output of the second amplifier and generates the dominant pole.

In another feature, each of the first and second MOS transistors includes a deep N well region.

In another feature, each of the first and second LPFs comprises a RC circuit.

In another feature, each of the first and second LPFs comprises an $N^{th}$ order filter, where N is an integer greater than 1.

In another feature, each of the first and second amplifiers comprises a low-frequency transconductance amplifier having a negative gain.

In another feature, the Colpitts oscillator further comprises a bias generator that is coupled to the tank circuit.

In other features, the first amplifier comprises a bipolar junction transistor (BJT). The BJT comprises a parasitic NPN BJT. The BJT is selected from a group consisting of vertical parasitic BJT and lateral parasitic BJT.

In other features, the first amplifier comprises a MOS transistor having a gate area that is greater than a gate area of the first transistor. The first amplifier comprises a MOS transistor having a gate area that is five times greater than a gate area of the first transistor. The first amplifier comprises a MOS transistor having a gate area that is ten times greater than a gate area of the first transistor. The first amplifier comprises a MOS transistor having a gate area that is twenty times greater than a gate area of the first transistor. The first amplifier comprises a MOS transistor having a gate area that is fifty times greater than a gate area of the first transistor. The first LPF comprises a resistance and a transistor having a control terminal that communicates with the resistance and first and second terminals connected together. The first LPF comprises a distributed resistance/capacitance (RC) circuit.

In still other features, a Colpitts oscillator comprises a tank circuit, first and second transistors and a first feedback circuit. The first transistor includes a bulk, a first region, a second region, and a control region, wherein the first region communicates with the tank circuit. The second transistor includes a bulk, a first region, a second region, and a control region, wherein the first region of the second transistor communicates with the second region of the first transistor. The bulks of the first and second transistors are connected to the second region of the second transistor. The first feedback circuit communicates with the second and control regions of the second transistor.

In another feature, each of the first and second transistors includes a metal oxide semiconductor (MOS) transistor, and the first, second, and control regions include drain, source, and gate regions, respectively.

In another feature, each of the first and second transistors includes a deep N well region.

In another feature, the Colpitts oscillator further comprises a first capacitance that has a first node that communicates with the control region of the first transistor and a second node that communicates with the second region of the second transistor.

In another feature, the Colpitts oscillator further comprises a first resistance and a bias generator. The first resistance communicates with the control region of the first transistor. The bias generator is coupled to the control region of the first transistor via the first resistance.

In another feature, the first active circuit comprises a first low-pass filter (LPF), a first amplifier, and a first capacitance. The first LPF communicates with the second region of the second transistor, receives a signal having oscillator and noise components, filters the oscillator component, and passes the noise component to an output. The first amplifier communicates with the output and has an output that communicates with the control region of the second transistor. The first capacitance communicates with the output of the first amplifier and generates a dominant pole at a frequency of the noise component.

In another feature, the Colpitts oscillator further comprises third and fourth transistors and a second feedback circuit. The third transistor includes a bulk, first region, a second region, and a control region, wherein the first region of the third transistor communicates with the tank circuit. The fourth transistor includes a bulk, a first region, a second region, and a control region, wherein the first region of the fourth transistor communicates with the second region of the third transistor. The bulks of the third and fourth transistors are connected to the second region of the fourth transistor. The second feedback circuit communicates with the second and control regions of the fourth transistor.

In another feature, each of the third and fourth transistors includes a metal oxide semiconductor (MOS) transistor, and the first, second, and control regions include drain, source, and gate regions, respectively.

In another feature, each of the third and fourth transistors includes a deep N well region.

In another feature, the Colpitts oscillator further comprises a second capacitance that has a first node that communicates with the control region of the third transistor and a second node that communicates with the second region of the fourth transistor.

In another feature, the Colpitts oscillator further comprises a first resistance and a bias generator. The first resistance communicates with the control region of the third transistor. The bias generator is coupled to biases the control region of the third transistor via the first resistance.

In another feature, the second feedback circuit comprises a second LPF, a second amplifier, and a second capacitance. The second LPF communicates with the second region of the fourth transistor, receives the signal, filters the oscillator component, and passes the noise component to an output. The second amplifier communicates with the output of the second LPF and has an output that communicates with the control region of the fourth transistor. The second capacitance communicates with the output of the second amplifier and generates the dominant pole.

In another feature, each of the first and second LPFs comprises a RC circuit.

In another feature, each of the first and second LPFs comprises an $N^{th}$ order filter, where N is an integer greater than 1.

In another feature, each of the first and second amplifiers comprises a low-frequency transconductance amplifier having a negative gain.

In other features, the first amplifier comprises a bipolar junction transistor (BJT). The BJT comprises a parasitic NPN BJT. The BJT is selected from a group consisting of vertical parasitic BJT and lateral parasitic BJT. The first amplifier comprises a MOS transistor having a gate area that is greater than a gate area of the first transistor. The first amplifier comprises a MOS transistor having a gate area that is five times greater than a gate area of the first transistor.

In other features, the first amplifier comprises a MOS transistor having a gate area that is ten times greater than a gate area of the first transistor. The first amplifier comprises a MOS transistor having a gate area that is twenty times greater than a gate area of the first transistor. The first amplifier comprises a MOS transistor having a gate area that is fifty times greater than a gate area of the first transistor. The first LPF comprises a resistance and a transistor having a control terminal that communicates with the resistance and first and second terminals connected together. The first LPF comprises a distributed resistance/capacitance (RC) circuit.

In still other features, a method for providing a Colpitts oscillator comprises providing a tank circuit, providing a first transistor having a first region, a second region, and a control region, communicating with the tank circuit via the first region, providing a first feedback circuit, and communicating with the second and control regions via the first feedback circuit.

In another feature, the method further comprises providing a first low-pass filter (LPF) of the first feedback circuit, communicating with the second region via the first LPF, receiving a signal having oscillator and noise components from the second region, filtering the oscillator component, and passing the noise component to an output. The method further comprises providing a first amplifier of the first feedback circuit, communicating with the output via the first amplifier and communicating an output of the first amplifier to the control region. The method further comprises providing a first capacitance of the first feedback circuit, communicating with the output of the first amplifier via the first capacitance, and generating a dominant pole at a frequency of the noise component.

In another feature, the method further comprises providing a second transistor having a first region, a second region, and a control region, communicating with the tank circuit via the first region of the second transistor, providing a second feedback circuit, and communicating with the second and control regions of the second transistor via the second feedback circuit.

In another feature, the method further comprises providing a second LPF of the second feedback circuit, communicating with the second region of the second transistor via the second LPF, receiving the signal from the second region of the second transistor, filtering the oscillator component, and passing the noise component to an output. The method further comprises providing a second amplifier of the second feedback circuit, communicating with the output of the second LPF via the second amplifier, and communicating an output of the second amplifier to the control region of the second transistor. The method further comprises providing a second capacitance of the second feedback circuit, communicating with the output of the second amplifier via the second capacitance, and generating the dominant pole.

In another feature, each of the first and second transistors includes a metal oxide semiconductor (MOS) transistor, and the first, second, and control regions include drain, source, and gate regions, respectively.

In another feature, each of the first and second LPFs includes a RC circuit.

In another feature, each of the first and second LPFs includes an $N^{th}$ order filter, where N is an integer greater than 1.

In another feature, each of the first and second amplifiers includes a low-frequency transconductance amplifier having a negative gain.

In another feature, the method further comprises generating a bias signal that biases the tank circuit.

In still other features, a method for providing a Colpitts oscillator comprises providing first and second metal oxide semiconductor (MOS) transistors each having a bulk, source, gate, and drain, wherein the bulk of the first and second MOS transistors is connected to the source of the first and second MOS transistors, respectively. The method further comprises providing a tank circuit, biasing the tank circuit and the gate of the first and second MOS transistors, and communicating with the tank circuit via the first and second MOS transistors.

In another feature, each of the first and second MOS transistors includes a deep N well region.

In another feature, the method further comprises providing first and second inductances of the tank circuit each having first and second nodes, communicating with a voltage source via the first nodes, and communicating with the drains of the first and second MOS transistors via the second nodes, respectively. The method further comprises providing first and second capacitances of the tank circuit each having first and second nodes, communicating with the second nodes of the first and second inductances via the first nodes of the first and second capacitances, respectively, and communicating with the sources of the first and second MOS transistors via the second nodes of the first and second capacitances, respectively. The method further comprises providing a third capacitance of the tank circuit having first and second nodes and communicating with the second nodes of the first and second capacitances via the first and second nodes of the third capacitance, respectively.

In still other features, a method for providing a Colpitts oscillator comprises providing a first metal oxide semiconductor (MOS) transistor having a bulk, source, gate, and drain, and connecting the bulk to the source. The method further comprises providing a tank circuit, coupling the first MOS transistor to the tank circuit, providing a first feedback circuit, and communicating with the source and the gate via the first feedback circuit.

In another feature, the method further comprises providing a first low-pass filter (LPF) of the first feedback circuit, communicating with the source via the first LPF, receiving a signal having oscillator and noise components from the source, filtering the oscillator component, and passing the noise component to an output. The method further comprises providing a first amplifier of the first feedback circuit, communicating with the output via the first amplifier, and communicating an output of the first amplifier to the gate. The method further comprises providing a first capacitance of the first feedback circuit, communicating with the output of the first amplifier via the first capacitance, and generating a dominant pole at a frequency of the noise component.

In another feature, the method further comprises providing a second MOS transistor having a bulk, source, gate, and drain, and connecting the bulk and source of the second MOS transistor. The method further comprises coupling the second MOS transistor to the tank circuit, providing a second feedback circuit, and communicating with the source and gate of the second MOS transistor via the second feedback circuit.

In another feature, the method further comprises providing a second LPF of the second feedback circuit, communicating with the source of the second MOS transistor via the second LPF, receiving the signal from the source of the second MOS transistor, filtering the oscillator component, and passing the noise component to an output of the second LPF. The method further comprises providing a second amplifier of the second feedback circuit, communicating with the output of the second LPF via the second amplifier, and communicating an output of the second amplifier to the gate of the second MOS transistor. The method further comprises providing a second capacitance of the second feedback circuit, communicating with the output of the second amplifier via the second capacitance, and generating the dominant pole.

In another feature, each of the first and second MOS transistors includes a deep N well region.

In another feature, each of the first and second LPFs includes a RC circuit.

In another feature, each of the first and second LPFs includes an $N^{th}$ order filter, where N is an integer greater than 1.

In another feature, each of the first and second amplifiers includes a low-frequency transconductance amplifier having a negative gain.

In another feature, the method further comprises generating a bias signal that biases the tank circuit.

In still other features, a method for providing a Colpitts oscillator comprises providing first and second transistors each having a bulk, a first region, a second region, and a control region, wherein the first region of the second transistor communicates with the second region of the first transistor. The method further comprises connecting the bulks of the first and second transistors to the second region of the second transistor. The method further comprises providing a tank circuit and communicating with the tank circuit via the first region of the first transistor. The method further comprises providing a first feedback circuit and communicating with the second and control regions of the second transistor via the first active feedback circuit.

In another feature, each of the first and second transistors includes a metal oxide semiconductor (MOS) transistor, and the first, second, and control regions include drain, source, and gate regions, respectively.

In another feature, each of the first and second transistors includes a bipolar junction transistor (BJT), and the first, second, and third regions include collector, emitter, and base regions, respectively.

In another feature, each of the first and second transistors includes a deep N well region.

In another feature, the method further comprises providing a first capacitance having first and second nodes, communicating with the control region of the first transistor via the first node, and communicating with the second region of the second transistor via the second node.

In another feature, the method further comprises providing a first resistance and biasing the control region of the first transistor via the first resistance.

In another feature, the method further comprises providing a first low-pass filter (LPF) of the first feedback circuit, communicating with the second region of the second transistor via the first LPF, receiving a signal having oscillator and noise components from the second region of the second transistor, filtering the oscillator component, and passing the noise component to an output. The method further comprises providing a first amplifier of the first feedback circuit, communicating with the output via the first amplifier, and communicating an output of the first amplifier to the control region of the second transistor. The method further comprises providing a first capacitance of the first feedback circuit, communicating with the output of the first amplifier via the first capacitance, and generating a dominant pole at a frequency of the noise component.

In another feature, the method further comprises providing third and fourth transistors each having a bulk, a first region, a second region, and a control region, wherein the first region of the fourth transistor communicates with the second region of the third transistor. The method further comprises connecting the bulks of the third and fourth transistors to the second region of the fourth transistor. The method further comprises communicating with the tank circuit via the first region of the third transistor. The method further comprises providing a second feedback circuit and communicating with the second and control regions of the fourth transistor via the second feedback circuit.

In another feature, each of the third and fourth transistors includes a metal oxide semiconductor (MOS) transistor, and the first, second, and control regions include drain, source, and gate regions, respectively.

In another feature, each of the third and fourth transistors includes a deep N well region.

In another feature, the method further comprises providing a second capacitance having first and second nodes, communicating with the control region of the third transistor via the first node of the second capacitance, and communicating with the second region of the fourth transistor via the second node of the second capacitance.

In another feature, the method further comprises providing a first resistance and biasing the control region of the third transistor via the first resistance.

In another feature, the method further comprises providing a second LPF of the second feedback circuit, communicating with the second region of the fourth transistor via the second LPF, receiving a signal having oscillator and noise components from the second region of the fourth transistor, filtering the oscillator component, and passing the noise component to an output of the second LPF. The method further comprises providing a second amplifier of the second feedback circuit, communicating with the output of the second LPF via the second amplifier, and communicating an output of the second amplifier to the control region of the fourth transistor. The method further comprises providing a second capacitance of the second feedback circuit, communicating with the output of the second amplifier via the second capacitance, and generating the dominant pole.

In another feature, each of the first and second LPFs includes a RC circuit.

In another feature, each of the first and second LPFs includes an $N^{th}$ order filter, where N is an integer greater than 1.

In another feature, each of the first and second amplifiers includes a low-frequency transconductance amplifier having a negative gain.

In still other features, a Colpitts oscillator comprises tank means for storing energy. The Colpitts oscillator further comprises a first transistor that includes a first region, a second region, and a control region, wherein the first region communicates with the tank means. The Colpitts oscillator further comprises first feedback means for providing active feedback by communicating with the second and control regions.

In another feature, the first feedback means comprises first low-pass filter (LPF) means for receiving a signal having oscillator and noise components from the second region, for filtering the oscillator component, and for passing the noise component to an output. The first feedback means further comprises first amplifier means for amplifying the output and for communicating an output to the control region. The first feedback means further comprises first capacitance means for communicating with the output of the first amplifier means and for generating a dominant pole at a frequency of the noise component.

In another feature, the Colpitts oscillator further comprises a second transistor that includes a first region, a second region, and a control region, wherein the first region of the second transistor communicates with the tank means. The Colpitts oscillator further comprises second feedback means for providing active feedback by communicating with the second and control regions of the second transistor.

In another feature, the second feedback means comprises second LPF means for receiving the signal from the second region of the second transistor, for filtering the oscillator component, and for passing the noise component to an output. The second feedback means further comprises second amplifier means for amplifying the output of the second LPF means and for communicating an output to the control region of the second transistor. The second feedback means further comprises second capacitance means for communicating with the output of the second amplifier means and for generating the dominant pole.

In another feature, each of the first and second transistors includes a metal oxide semiconductor (MOS) transistor, and the first, second, and control regions include drain, source, and gate regions, respectively.

In another feature, each of the first and second LPF means comprises a RC filter.

In another feature, each of the first and second LPF means comprises an $N^{th}$ order filter, where N is an integer greater than 1.

In another feature, each of the first and second amplifier means comprises a low-frequency transconductance amplifier having a negative gain.

In another feature, the Colpitts oscillator further comprises bias generating means for biasing the tank means.

In other features, the first amplifier means comprises a bipolar junction transistor (BJT). The BJT comprises a parasitic NPN BJT. The BJT is selected from a group consisting of vertical parasitic BJT and lateral parasitic BJT.

In other features, the first amplifier means comprises a MOS transistor having a gate area that is greater than a gate area of the first transistor. The first amplifier means comprises a MOS transistor having a gate area that is five times greater than a gate area of the first transistor. The first amplifier means comprises a MOS transistor having a gate area that is ten times greater than a gate area of the first transistor. The first amplifier means comprises a MOS transistor having a gate area that is twenty times greater than a gate area of the first transistor. The first amplifier means comprises a MOS transistor having a gate area that is fifty times greater than a gate area of the first transistor. The first LPF means comprises a resistance and a transistor having a control terminal that communicates with the resistance and first and second terminals connected together. The first LPF means comprises a distributed resistance/capacitance (RC) circuit.

In still other features, a Colpitts oscillator comprises tank means for storing energy. The Colpitts oscillator further comprises a first metal oxide semiconductor (MOS) transistor that is coupled to the tank means and that includes a bulk, source, gate, and drain, wherein the bulk is connected to the source. The Colpitts oscillator further comprises a second MOS transistor that communicates with the tank means and that includes a bulk, source, gate, and drain, wherein the bulk of the second MOS transistor is connected to the source of the second MOS transistor. The Colpitts oscillator further comprises bias generating means for biasing the tank means and for biasing the gates of the first and second MOS transistors.

In another feature, each of the first and second MOS transistors includes a deep N well region.

In another feature, the tank means comprises first and second inductance means having first nodes for communicating with a voltage source and second nodes for communicating with the drains of the first and second MOS transistors, respectively. The tank means further comprises first and second capacitance means having first nodes for communicating with the second nodes of the first and second inductance means, respectively, and second nodes for communicating with the sources of the first and second MOS transistors, respectively. The tank means further comprises third capacitance means having first and second nodes for communicating with the second nodes of the first and second capacitance means, respectively.

In still other features, a Colpitts oscillator comprises tank means for storing energy. The Colpitts oscillator further comprises a first metal oxide semiconductor (MOS) transistor that is coupled to the tank means and that includes a bulk, source, gate, and drain, wherein the bulk is connected to the source. The Colpitts oscillator further comprises first feedback means for providing active feedback by communicating with the source and the gate.

In another feature, the first feedback means comprises first low-pass filter (LPF) means for receiving a signal having oscillator and noise components from the source, for filtering the oscillator component, and for passing the noise component to an output. The first feedback means further comprises first amplifier means for amplifying the output and for communicating an output to the gate. The first feedback means further comprises first capacitance means for communicating with the output of the first amplifier means and for generating a dominant pole at a frequency of the noise component.

In another feature, the Colpitts oscillator further comprises a second MOS transistor that is coupled to the tank means and that includes a bulk, source, gate, and drain, wherein the bulk of the second MOS transistor is connected to the source of the second MOS transistor. The Colpitts oscillator further comprises second feedback means for providing active feedback by communicating with the source and the gate of the second MOS transistor.

In another feature, the second feedback means comprises second LPF means for receiving the signal from the source of the second MOS transistor, for filtering the oscillator component, and for passing the noise component to an output. The second feedback means further comprises second amplifier means for amplifying the output of the second LPF means and for communicating an output to the gate of the second MOS transistor. The second feedback means further comprises second capacitance means for communicating with the output of the second amplifier means and for generating the dominant pole.

In another feature, each of the first and second MOS transistors includes a deep N well region.

In another feature, each of the first and second LPF means comprises a RC filter.

In another feature, each of the first and second LPF means comprises an $N^{th}$ order filter, where N is an integer greater than 1.

In another feature, each of the first and second amplifier means comprises a low-frequency transconductance amplifier having a negative gain.

In another feature, the Colpitts oscillator further comprises bias generating means for biasing the tank means.

In other features, the first amplifier means comprises a bipolar junction transistor (BJT). The BJT comprises a parasitic NPN BJT. The BJT is selected from a group consisting of vertical parasitic BJT and lateral parasitic BJT.

In other features, the first amplifier means comprises a MOS transistor having a gate area that is greater than a gate area of the first transistor. The first amplifier means comprises a MOS transistor having a gate area that is five times greater than a gate area of the first transistor. The first amplifier means comprises a MOS transistor having a gate area that is ten times greater than a gate area of the first transistor. The first amplifier means comprises a MOS transistor having a gate area that is twenty times greater than a gate area of the first transistor. The first amplifier means comprises a MOS transistor having a gate area that is fifty times greater than a gate area of the first transistor. The first LPF means comprises a resistance and a transistor having a control terminal that communicates with the resistance and first and second terminals connected together. The first LPF means comprises a distributed resistance/capacitance (RC) circuit.

In still other features, a Colpitts oscillator comprises tank means for storing energy. The Colpitts oscillator further comprises a first transistor that includes a bulk, a first region, a second region, and a control region, wherein the first region communicates with the tank means. The Colpitts oscillator further comprises a second transistor that includes a bulk, a first region, a second region, and a control region, wherein the first region of the second transistor communicates with the second region of the first transistor. The Colpitts oscillator further comprises first feedback means for providing active feedback by communicating with the second and control regions of the second transistor. The bulks of the first and second transistors are connected to the second region of the second transistor.

In another feature, each of the first and second transistors includes a metal oxide semiconductor (MOS) transistor, and the first, second, and control regions include drain, source, and gate regions, respectively.

In another feature, each of the first and second transistors includes a deep N well region.

In another feature, the Colpitts oscillator further comprises first capacitance means for providing capacitance having a first node for communicating with the control region of the first transistor and a second node for communicating with the second region of the second transistor.

In another feature, the Colpitts oscillator further comprises first resistance means for providing resistance that communicates with the control region of the first transistor. The Colpitts oscillator further comprises bias generating means for biasing the control region of the first transistor via the first resistance means.

In another feature, the first feedback means comprises first low-pass filter (LPF) means for receiving a signal having oscillator and noise components from the second region of the second transistor, for filtering the oscillator component, and for passing the noise component to an output. The first feedback means further comprises first amplifier means for amplifying the output and for communicating an output to the control region of the second transistor. The first feedback means further comprises first capacitance means for communicating with the output of the first amplifier means and for generating a dominant pole at a frequency of the noise component.

In another feature, the Colpitts oscillator further comprises a third transistor that includes a bulk, first region, a second region, and a control region, wherein the first region of the third transistor communicates with the tank means. The Colpitts oscillator further comprises a fourth transistor that includes a bulk, a first region, a second region, and a control region, wherein the first region of the fourth transistor communicates with the second region of the third transistor. The Colpitts oscillator further comprises second feedback means for providing active feedback by communicating with the second and control regions of the fourth transistor. The bulks of the third and fourth transistors are connected to the second region of the fourth transistor.

In another feature, each of the third and fourth transistors includes a metal oxide semiconductor (MOS) transistor, and the first, second, and control regions include drain, source, and gate regions, respectively.

In another feature, each of the third and fourth transistors includes a deep N well region.

In another feature, the Colpitts oscillator further comprises second capacitance means for providing capacitance having a first node for communicating with the control region of the third transistor and a second node for communicating with the second region of the fourth transistor.

In another feature, the Colpitts oscillator further comprises first resistance means for providing resistance that communicates with the control region of the third transistor. The Colpitts oscillator further comprises bias generating means for biasing the control region of the third transistor via the first resistance means.

In another feature, the second feedback means comprises second LPF means for receiving the signal from the second region of the fourth transistor, for filtering the oscillator component, and for passing the noise component to an output. The second feedback means further comprises second amplifier means for amplifying the output of the second LPF means and for communicating an output to the control region of the fourth transistor. The second feedback means further comprises second capacitance means for communicating with the output of the second amplifier means and for generating the dominant pole.

In another feature, each of the first and second LPF means comprises a RC filter.

In another feature, each of the first and second LPF means comprises an $N^{th}$ order filter, where N is an integer greater than 1.

In another feature, each of the first and second amplifier means comprises a low-frequency transconductance amplifier having a negative gain.

In other features, the first amplifier means comprises a bipolar junction transistor (BJT). The BJT comprises a parasitic NPN BJT. The BJT is selected from a group consisting of vertical parasitic BJT and lateral parasitic BJT.

In other features, the first amplifier means comprises a MOS transistor having a gate area that is greater than a gate area of the first transistor. The first amplifier means comprises a MOS transistor having a gate area that is five times greater than a gate area of the first transistor. The first amplifier means comprises a MOS transistor having a gate area that is ten times greater than a gate area of the first transistor. The first amplifier means comprises a MOS transistor having a gate area that is twenty times greater than a gate area of the first transistor. The first amplifier means comprises a MOS transistor having a gate area that is fifty times greater than a gate area of the first transistor. The first LPF means comprises a resistance and a transistor having a control terminal that communicates with the resistance and first and second terminals connected together. The first LPF means comprises a distributed resistance/capacitance (RC) circuit.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1A is a schematic of a Colpitts oscillator according to the prior art;

FIG. 1B shows a metal oxide semiconductor (MOS) transistor comprising a source of noise and an ideal MOS transistor;

DETAILED DESCRIPTION

Figure 2A:
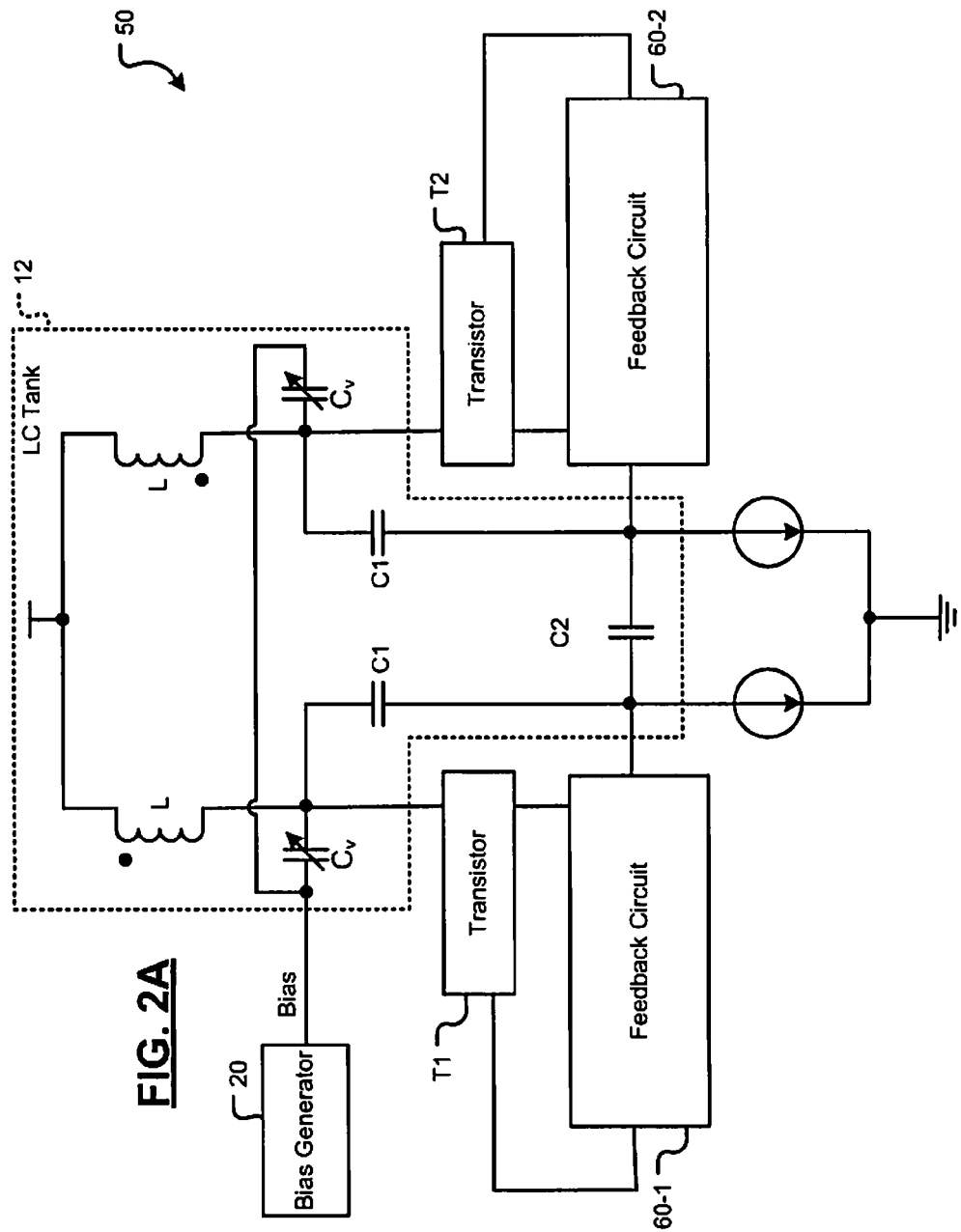
FIG. 2A is a schematic of a Colpitts oscillator comprising feedback circuits according to the present disclosure.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

When Colpitts oscillators are implemented using metal oxide semiconductor (MOS) transistors, flicker noise may be minimized in many ways. For example, feedback circuits may be used to minimize flicker noise. Feedback circuits may comprise low-pass filters (LPFs), low-frequency inverting feedback amplifiers (amplifiers), and feedback capacitances. Alternatively or additionally, flicker noise may be further reduced by tying bulks of the MOS transistors to source terminals of the MOS transistors. Additionally, the MOS transistors having bulks tied to source terminals may be cascoded.

Figure 2B:
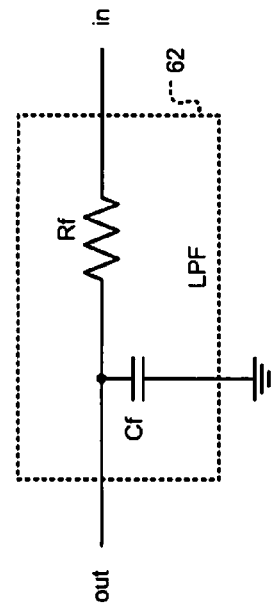
FIG. 2B illustrates exemplary transistors and feedback circuits according to the present disclosure.
Figure 2C:
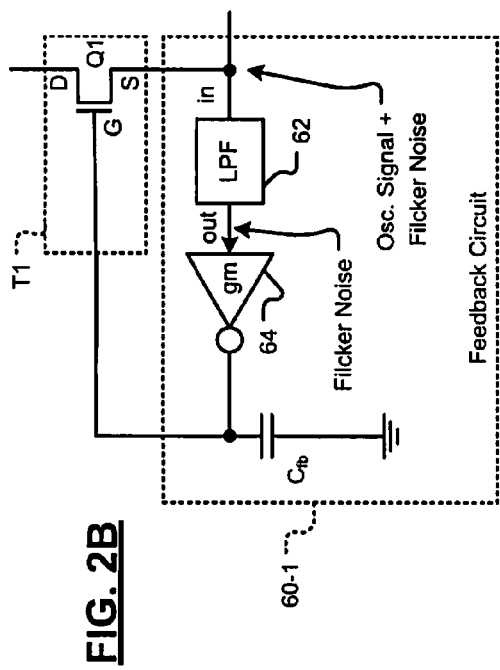
FIG. 2C is a schematic of a single stage RC filter.
Figure 2D:
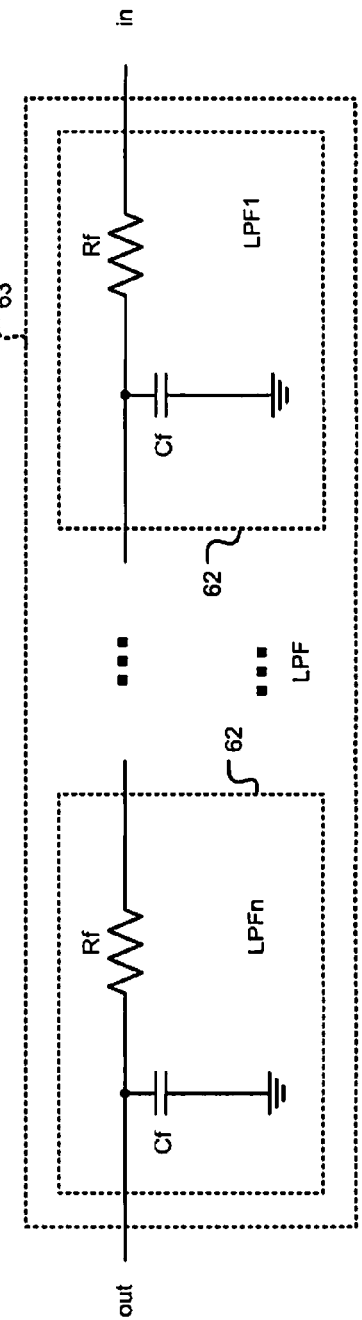
FIG. 2D is a schematic of a higher order RC filter.
Figure 2E:
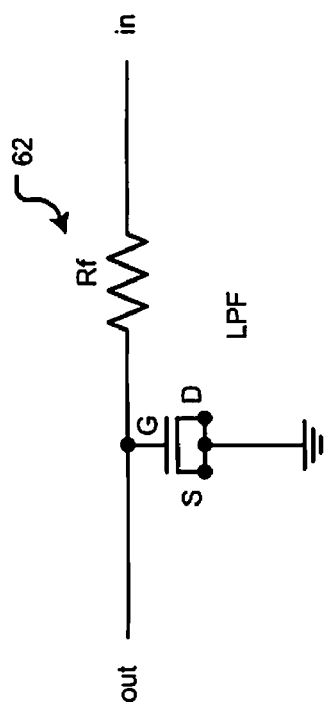
FIG. 2E is a schematic of an alternate low pass filter stage including a transistor-based capacitance.
Figure 2F:
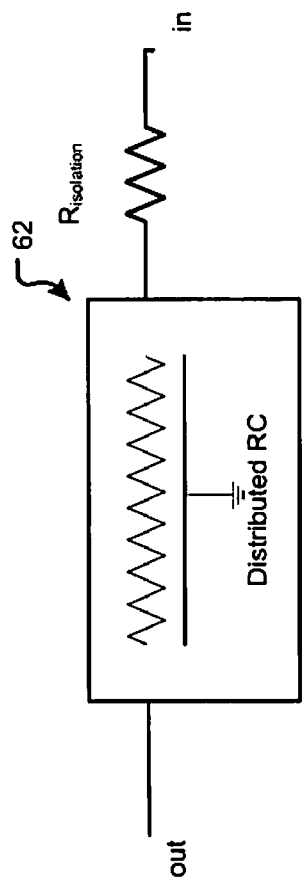
FIG. 2F is a schematic of another alternate low pass filter stage including a distributed RC circuit.
Figure 3B:
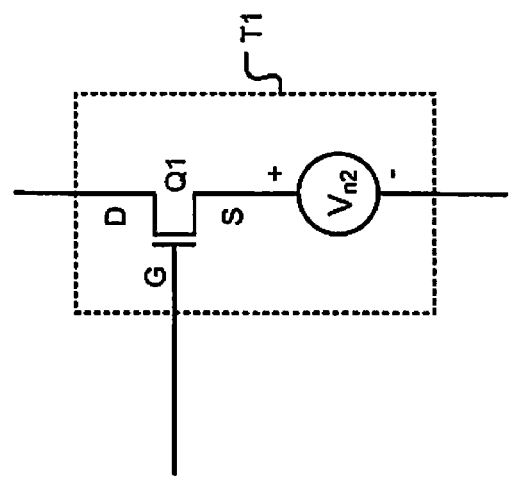
FIG. 3B shows flicker noise at a source terminal of a MOS transistor.
Figure 3A:
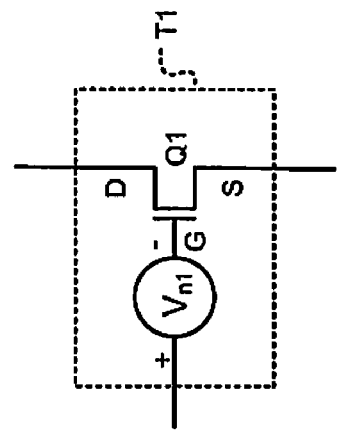
FIG. 3A shows flicker noise at a gate terminal of a MOS transistor.
Figure 4A:
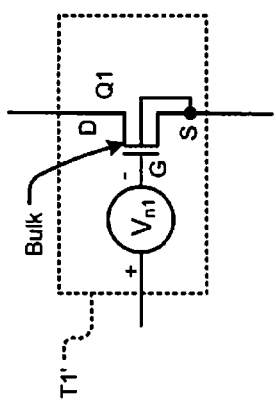
FIG. 4A shows a MOS transistor with a bulk connected to a source.
Figure 4B:
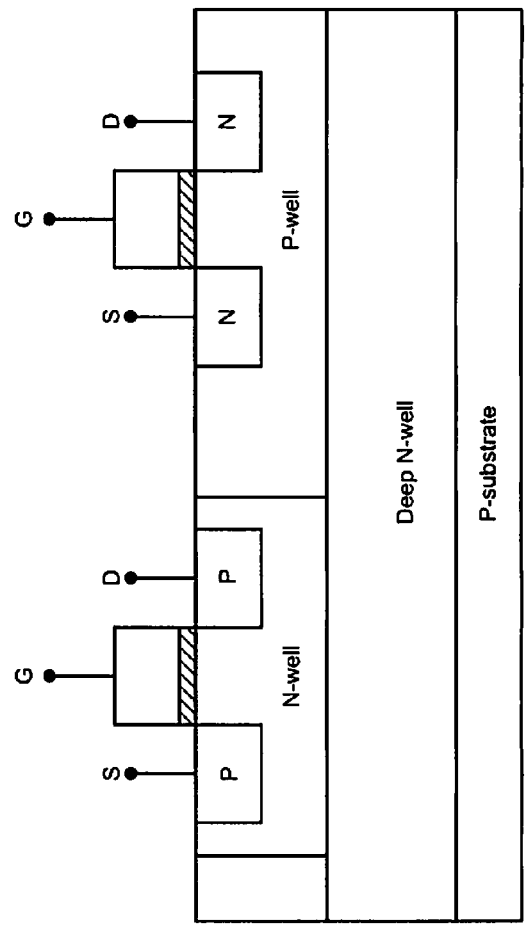
FIG. 4B shows a MOS transistor with a deep n-well.

Before a detailed description is presented, a brief overview of the drawings is presented. FIG. 2A shows a Colpitts oscillator implemented using MOS transistors and feedback circuits. FIG. 2B illustrates exemplary transistors and feedback circuits. FIGS. 2C and 2D show different configurations of LPFs that may be used in the feedback circuits. FIGS. 2E and 2F show capacitor-based and distributed RC-based LPF implementations, respectively. FIGS. 3A and 3B show schematically flicker noise that may be present at the gate and source terminals of MOS transistors, respectively. FIG. 4A shows a MOS transistor with the bulk tied to the source terminal. FIG. 4B shows a cross section of a MOS transistor with a deep n-well.

Figure 5:
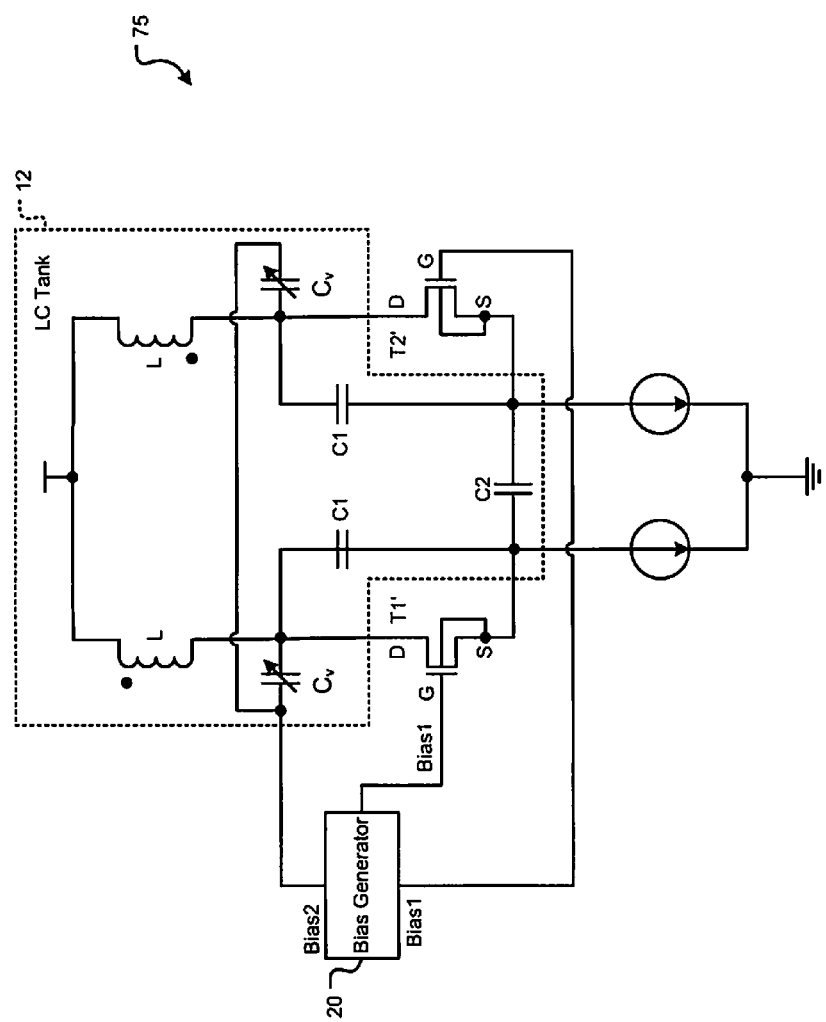
FIG. 5 is a schematic of a Colpitts oscillator comprising MOS transistors having bulks connected to source terminals according to the present disclosure.
Figure 6A:
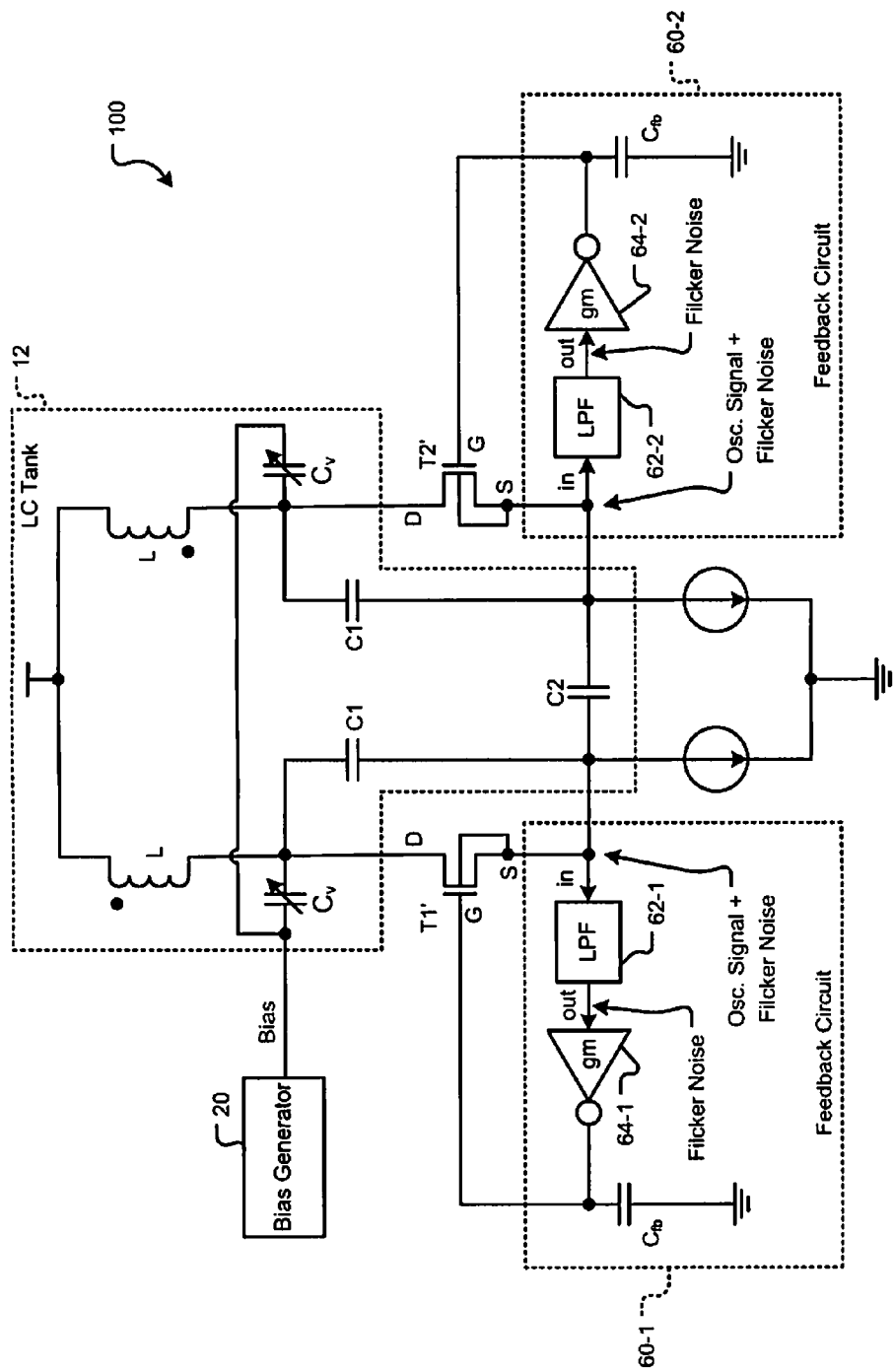
FIG. 6A is a schematic of a Colpitts oscillator comprising MOS transistors having bulks connected to source terminals and further comprising feedback circuits according to the present disclosure.
Figure 6B:
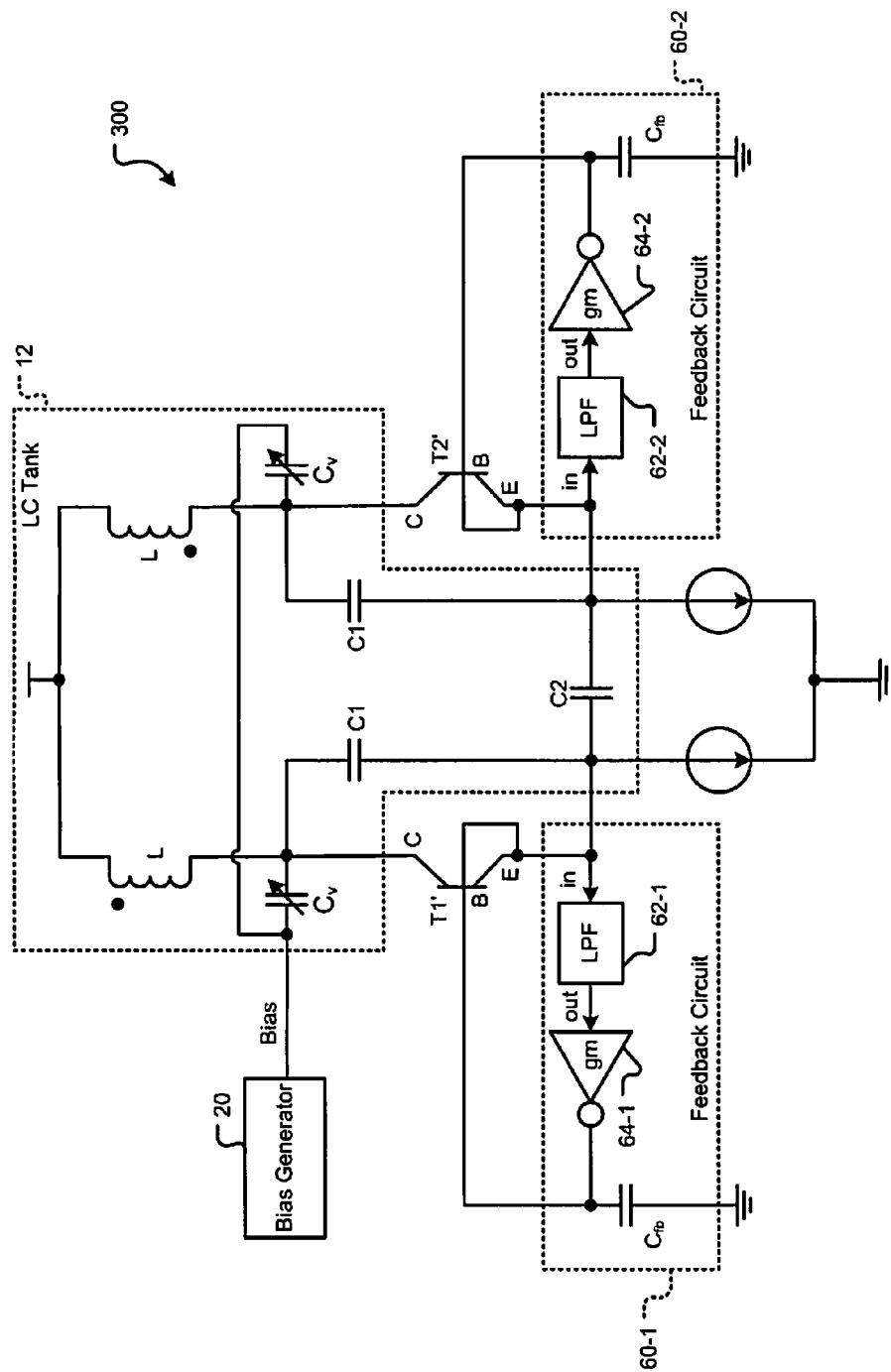
FIG. 6B is a schematic diagram similar to FIG. 6A including BJTs instead of MOS transistors.
Figure 7:
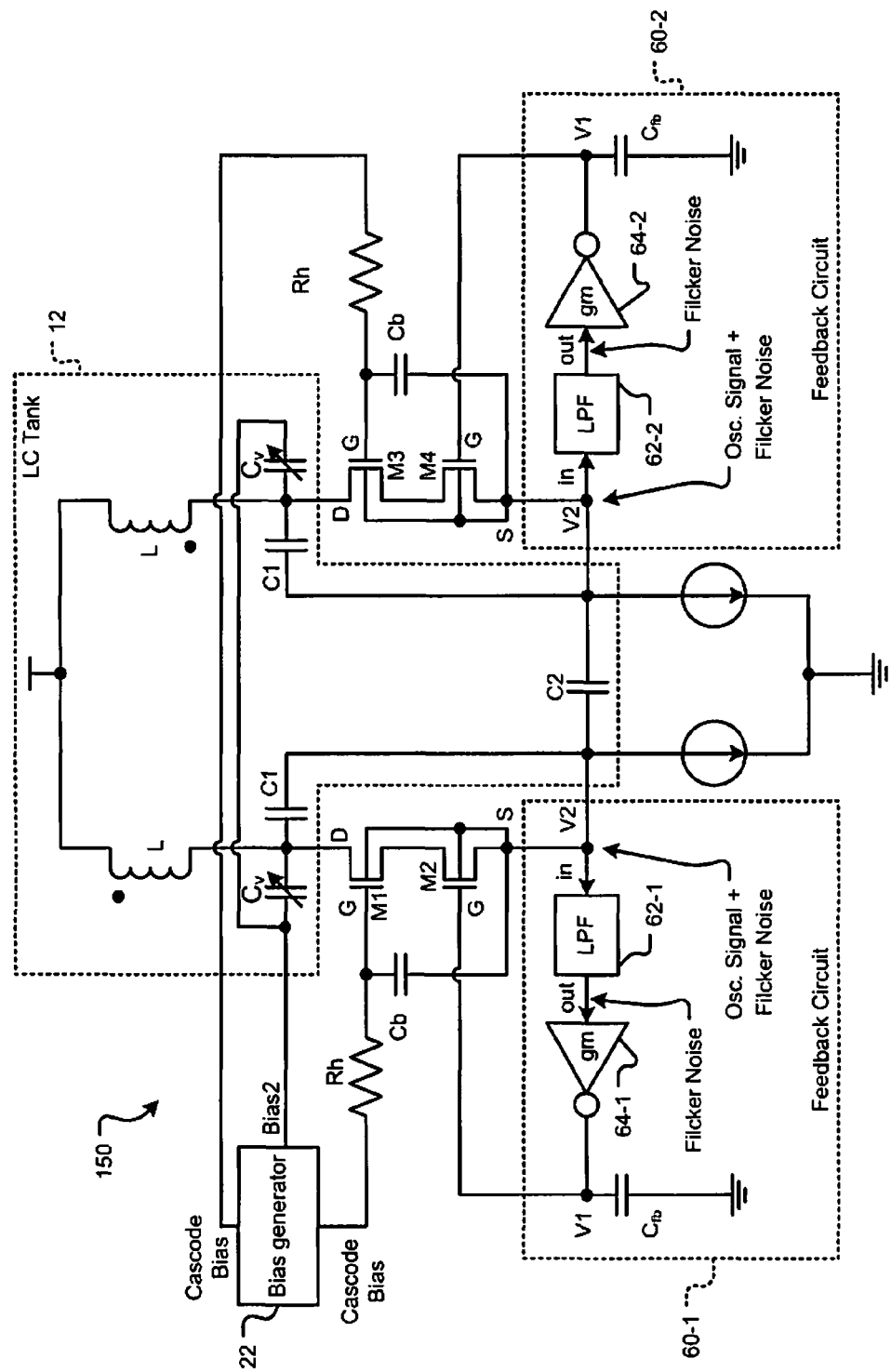
FIG. 7 is a schematic of a Colpitts oscillator comprising cascoded MOS transistors having bulks connected to source terminals and further comprising feedback circuits according to the present disclosure.

FIG. 5 shows a Colpitts oscillator implemented using MOS transistors having bulks tied to source terminals. FIG. 6A shows a Colpitts oscillator implemented using MOS transistors having bulks tied to source terminals and using feedback circuits. FIG. 6B shows a Colpitts oscillator similar to that shown in FIG. 6A but implemented using bipolar junction transistors (BJTs). FIG. 7 shows a Colpitts oscillator wherein MOS transistors having bulks tied to source terminals are cascoded and feedback circuits are used. FIG. 8A shows a bipolar junction transistor (BJT) used in the feedback circuit.

Figure 8B:
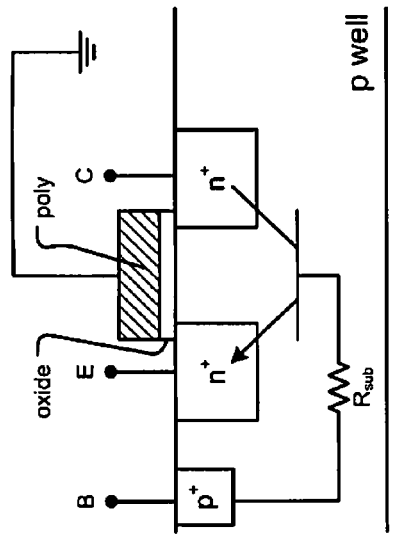
FIG. 8B illustrates an exemplary lateral parasitic bipolar junction transistor used in the feedback circuit of FIG. 8A.
Figure 8C:
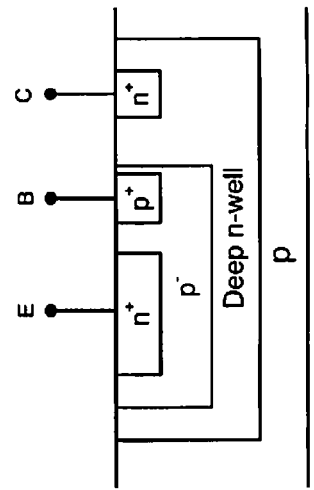
FIG. 8C illustrates an exemplary vertical parasitic bipolar transistor used in the feedback circuit of FIG. 8A.
Figure 8A:
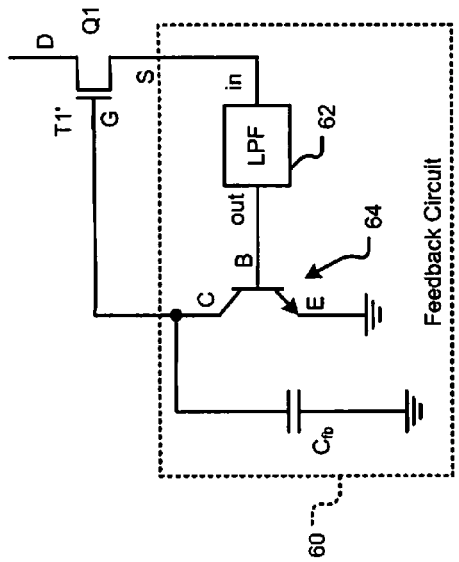
FIG. 8A illustrates a bipolar junction transistor used in the feedback circuit.
Figure 9:
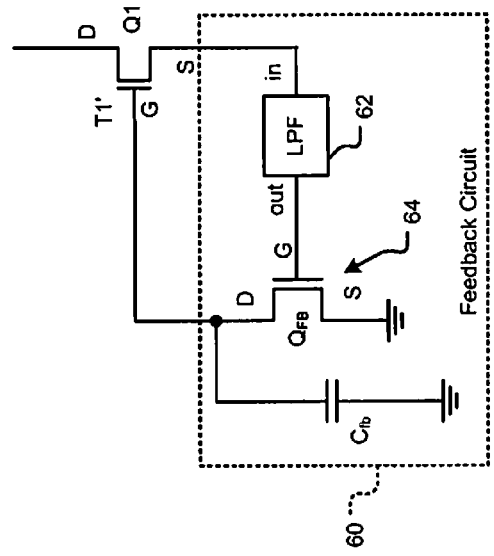
FIG. 9 illustrates a MOS transistor used in an alternate feedback circuit.

FIG. 8B shows an illustrative lateral parasitic bipolar junction transistor used in the feedback circuit of FIG. 8A. FIG. 8C shows an illustrative vertical parasitic bipolar junction transistor used in the feedback circuit of FIG. 8A. FIG. 9 shows a MOS transistor used in an alternative feedback circuit.

Referring now to FIGS. 2A-2D, a Colpitts oscillator (hereinafter oscillator) 50 implemented using transistors T1 and T2 and feedback circuits is shown. In FIG. 2A, the feedback circuits 60-1 and 60-2 (collectively feedback circuits 60) may minimize the flicker noise $V_{n1}$ present in an oscillator signal generated by the oscillator 50. The bias generator 20 biases the LC tank circuit 12 comprising inductances L, capacitances C1 and C2, and variable capacitances (varactors) $C_v$ that may be used for tuning.

In FIG. 2B, the feedback circuit 60-1 may comprise a passive filter such as a LPF 62, an active gain stage such as an amplifier 64, and a first feedback capacitance $C_{fb}$. The transistor T1 may comprise a MOS transistor with a gate (G), a source (S) and a drain (D). The feedback circuit 60-2 and the transistor T2 may be similar to the feedback circuit 60-1 and the transistor T1.

Typically, the frequency of the oscillator signal is greater than the frequency of the flicker noise. For example, in WiFi applications, where the frequency band is 2-4 GHz, the frequency of the oscillator signal that is input to quadrature mixer circuits may be 4-8 GHz while the frequency of the flicker noise may be less than 1 MHz. Additionally, the amplitude of the oscillator signal may be greater than the amplitude of the flicker noise. Accordingly, the oscillator signal may saturate the amplifiers 64 if the oscillator signal is not filtered or sufficiently attenuated. Saturation of the amplifiers 64, in turn, may generate undesirable intermodulation frequency components.

To prevent the amplifiers 64 from saturating and generating intermodulation frequency components, the LPFs 62 may filter or attenuate the oscillator signal and pass the flicker noise to the amplifiers 64. Specifically, the LPFs 62 may attenuate the oscillator signal, wherein the amplitude of the attenuated oscillator signal is less than the saturation voltage of transistors in the amplifiers 64.

In FIG. 2C, an example of the LPFs 62 is shown to comprise a single-pole RC filter circuit that includes a resistance $R_f$ and a capacitance $C_f$. Parasitic resistance $R_P$ (not shown) may occur between the capacitance $C_f$ and the reference potential or ground. In some implementations, the LPFs 62 are passive filters to prevent excessive voltage swing. The LPFs 62 may comprise the resistance $R_f$ and the capacitance $C_f$ arranged in a single-stage LPF 62 as shown in FIG. 2C.

In other implementations, multiple stage LPFs 62 may be used to provide further attenuation, where each stage has one pole. In FIG. 2D, a LPF 63 of an $N^{th}$ order filter comprising N cascaded LPF stages is shown, where N is an integer greater than 1. If N stages are used, approximately N poles are provided by the N cascaded LPF stages. If the N poles are located at $$\approx \frac{1}{10} f_{osc},$$

each pole contributes ≈20 dB voltage reduction at $f_{osc}$. Therefore, if $f_{osc}$ is at 2.4 GHz, the N poles contribute to N*20 dB. If N=5, then 5*20 dB=100 dB of reduction is provided.

The unity gain bandwidth $\omega_u$ of the feedback loop is based on $g_m$ and $C_{fb}$. More particularly, $$\omega_u = \frac{g_m}{C_{fb}}.$$

In some implementations, the passive filter poles are set much greater than the unity gain bandwidth $\omega_u$. Passive filter poles of the LPF 62 do not contribute significant phase shift in the unity gain bandwidth of the feedback loop. Unity gain of the feedback loop is typically set to be higher than the 1/f corner frequency of the oscillator transistors (for example Q1).

In addition to filtering the oscillator signal, the LPFs 62 provide a resistive coupling between the amplifiers 64 and the rest of the components of the oscillator 50. If the amplifiers 64 use large transistors, the input capacitances of the amplifiers 64 may be large. Consequently, the amplifiers 64 may not be coupled directly to the rest of the components of the oscillator 50. The resistances $R_f$ in the LPFs 62 in series with the amplifiers 64 provide resistive coupling between the amplifiers 64 and the rest of the components of the oscillator 50.

Referring back to FIG. 2B, the amplifiers 64 may include low-frequency transconductance amplifiers. Additionally, the amplifiers 64 may be inverting amplifiers. That is, the amplifiers 64 may have a negative gain. The negative gain may be set greater than or equal to X, where X is the desired amount of reduction in the flicker noise. For example, a gain of X=10 may reduce the flicker noise by a factor of 10.

The amplifiers 64 may amplify the flicker noise according to the predetermined negative gain and may generate amplified flicker noise that is 180 degrees out of phase with the flicker noise. When the amplified flicker noise is fed back to the gates of the MOS transistors T1 and T2, the amplified flicker noise may cancel or reduce the flicker noise. In some implementations, the transistors of the amplifiers 64 may be operated near saturation.

Additionally, the amplifiers 64 may generate wideband noise that can distort the oscillator signal. To limit the wideband noise and the gain of the amplifiers 64 at frequencies greater than the frequency of the flicker noise, a dominant pole is generated by connecting capacitances $C_{fb}$ to the amplifiers 64. Specifically, the dominant pole may be generated at the frequency of the flicker noise. The dominant pole may limit the gain of the amplifiers 64 to less than or equal to unity at frequencies higher than the frequency of the flicker noise. The dominant pole may allow the amplifiers 64 to provide the negative gain only at the frequency of the flicker noise. Thus, the amplifiers 64 may amplify only the flicker noise and not the wideband noise.

Referring now to FIGS. 2E and 2F, other exemplary LPF stages are shown. In FIG. 2E, the LPF stage 62 is shown to include the resistance $R_f$ and a capacitance $C_f$, which is provided by a transistor having a thin oxide layer. In other words, the source S and drain D of the transistor are connected to a reference potential and the gate G of the transistor communicates with the resistance $R_f$. For example only, the transistor may comprise a MOS transistor.

In FIG. 2F, the LPF stage 62 is shown to include a distributed RC circuit. An isolation resistance $R_{isolation}$ may be provided at an input of the LPF stage 62. Multi-stage arrangements of the LPFs in FIGS. 2E and 2F may also be used.

Referring now to FIGS. 3A and 3B, the magnitudes $V_{n1}$ and $V_{n2}$ of the flicker noise at the gate G and source S terminals of the transistor T1 are illustrated schematically, respectively. The feedback circuits 60 sense the flicker noise $V_{n2}$ at the source terminals S of the MOS transistors T1 and T2. Typically, $V_{n2}$ may be less than $V_{n1}$. Accordingly, the feedback circuits 60 may properly cancel or decrease the flicker noise if the feedback circuits 60 can accurately sense the flicker noise. The feedback circuits 60 may accurately sense the flicker noise $V_{n2}$ when the bulks of the MOS transistors T1 and T2 is tied to the source terminals S of the MOS transistors T1 and T2, respectively.

Referring now to FIG. 4A, a MOS transistor T1' is shown, wherein the bulk of the transistor Q1 is tied to the source S of the transistor Q1. The bulk of the MOS transistor T1' may be easily tied to the source of the MOS transistor T1' when the MOS transistor T1' comprises a deep n-well region. Referring now to FIG. 4B, a MOS transistor comprising a deep n-well region is shown. The deep n-well region is deeper than a n-well and a p-well as shown.

Referring now to FIG. 5, an oscillator 75 comprising MOS transistors T1' and T2' having bulks tied to the source terminals of the respective transistors is shown. The bias generator 20 biases the MOS transistors T1' and T2' and the LC tank circuit 12. The LC tank circuit 12 may comprise inductances L, capacitances C1 and C2, and variable capacitances (varactors) CV that may be used for tuning. The flicker noise present in the oscillator signal generated by the oscillator 75 is less than the flicker noise present in the oscillator signal generated by the oscillator 10 as shown in FIG. 1A. The magnitude of the flicker noise may be further decreased by using feedback circuits in addition to tying the bulks of the MOS transistors to the source terminals.

Referring now to FIGS. 6A and 6B, exemplary arrangements of the Colpitts oscillator according to the present disclosure are shown. In FIG. 6A, an oscillator 100 comprises MOS transistors T1' and T2' having the bulks tied to the source terminals and the feedback circuits 60. The bias generator 20 biases the LC tank circuit 12 comprising inductances L, capacitances C1 and C2, and variable capacitances (varactors) $C_v$ that may be used for tuning. The flicker noise present in the oscillator signal generated by the oscillator 100 may be less than the flicker noise present in the oscillator signals generated by the oscillators 75 and 50 as shown in FIGS. 5 and 2A, respectively. In FIG. 6B, the transistors T1' and T2' of FIG. 6A can be replaced by BJT transistors using a similar connection approach.

Additionally, MOS transistors having bulks tied to the source terminals may be cascoded. Referring now to FIG. 7, an oscillator 150 comprising MOS transistors M1-M4 is shown. The bulks of M1 and M2 are tied to the source terminal S of M2, and M1 and M2 are cascoded. The bulks of M3 and M4 are tied to the source terminal S of M4, and M3 and M4 are cascoded. A bias generator 22 generates bias signals that bias the gates G of the MOS transistors M1 and M3 via high resistances $R_h$. Additionally, the bias generator 22 generates bias signals that bias the LC tank circuit 12 comprising inductances L, capacitances C1 and C2, and variable capacitances (varactors) $C_v$ that may be used for tuning.

A first bootstrap capacitance $C_b$ is connected between the gate G of the MOS transistor M1 and the source S of the MOS transistor M2. A second bootstrap capacitance $C_b$ is connected between the gate G of the MOS transistor M3 and the source S of the MOS transistor M4. Additionally, the oscillator 150 may comprise the feedback circuits 60. A ratio of voltages V1 to V2 is approximately equal to 1. The flicker noise present in the oscillator signal generated by the oscillator 150 may be less than the flicker noise present in the oscillator signals generated by the oscillators 50, 75, and 100 as shown in FIGS. 2A, 5 and 6, respectively.

Referring now to FIGS. 8A-8C, the amplifier 64 in the feedback circuit 60 may include a bipolar junction transistor (BJT). A base B of the BJT communicates with an output of the LPF 62. A collector C of the BJT communicates with the feedback capacitance $C_{fb}$ and with a gate G of the transistor T1'. The emitter E communicates with a reference potential such as ground. It should be noted that the feedback circuit illustrated in FIG. 8A may be used in other configurations, such as, FIGS. 2A, 6A and 7, as described herein.

For example only, the BJT of FIG. 8A may be a lateral or vertical parasitic BJT. For example only, an NPN arrangement may be used. The NPN parasitic BJT tends to have much lower 1/f corner frequency noise as compared to MOS transistors. In FIG. 8B, an exemplary layout of the lateral parasitic BJT is shown. In FIG. 8C, an exemplary layout of the vertical parasitic BJT is shown.

Referring now to FIG. 9, the amplifier 64 in the feedback circuit 60 may include a MOS transistor $Q_{FB}$. For example only, a gate area of the MOS transistor $Q_{FP}$ may be much larger than the gate area of MOS transistor $Q_1$. The increased gate area of the feedback transistor $Q_{FB}$ tends to lower 1/f corner frequency noise. For example only, the gate area of the feedback transistor $Q_{FB}$ may be 5× larger than the gate area of transistor $Q_1$. For example only, the gate area of the feedback transistor $Q_{FB}$ may be 10× larger than the gate area of transistor $Q_1$. For example only, the gate area of the feedback transistor $Q_{FB}$ may be 20× larger than the gate area of transistor $Q_1$. For example only, the gate area of the feedback transistor $Q_{FB}$ may be 50× larger than the gate area of transistor $Q_1$. It should be noted that the feedback circuit illustrated in FIG. 9 may be used in other configurations, such as, FIGS. 2A, 6A and 7, as described herein.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A Colpitts oscillator configured to generate an oscillator signal having i) a first frequency and ii) a first amplitude, the Colpitts oscillator comprising:

an LC tank circuit comprising i) a plurality of capacitors and ii) a plurality of inductances, wherein the first frequency of the oscillator signal is based on the plurality of capacitors and the plurality of inductances;

a first transistor and a second transistor each in communication with the LC tank circuit, wherein, during operation of the Colpitts oscillator, each of the first transistor and the second transistor generates phase noise in the oscillator signal, and wherein the phase noise generated by each of the first transistor and the second transistor has a second frequency and a second amplitude;

a first feedback circuit configured to reduce the phase noise generated by the first transistor, the first feedback circuit comprising a first low-pass filter configured to i) attenuate the oscillator signal having the first amplitude and ii) pass the phase noise having the second amplitude that is generated by the first transistor, a first amplifier to i) invert and amplify the phase noise passed by the first low-pass filter and ii) generate a first amplified phase noise signal at an output of the first amplifier, wherein the first amplified phase noise signal is 180 degrees out of phase with the phase noise generated the first transistor, and a first feedback capacitance having i) a first end connected to the output of the first amplifier and ii) a second end connected to a reference potential, wherein the first feedback capacitance ensures that the first amplifier amplifies the phase noise passed by the first low-pass filter only at the second frequency; and a second feedback circuit configured to reduce the phase noise generated by the second transistor, the second feedback circuit comprising a second low-pass filter configured to i) attenuate the oscillator signal having the first amplitude and ii) pass the phase noise having the second amplitude that is generated by the second transistor, a second amplifier to i) invert and amplify the phase noise passed by the second low-pass filter and ii) generate a second amplified phase noise signal at an output of the second amplifier, wherein the second amplified phase noise signal is 180 degrees out of phase with the phase noise generated the second transistor, and a second feedback capacitance having i) a first end connected to the output of the second amplifier and ii) a second end connected to the reference potential, wherein the second feedback capacitance ensures that the second amplifier amplifies the phase noise passed by the second low-pass filter only at the second frequency, and wherein the second feedback capacitance is separate from the first feedback capacitance, wherein i) the first amplified phase noise signal at the output of the first amplifier is fed back to the first transistor to reduce the phase noise generated by the first transistor, and ii) the second amplified phase noise signal at the output of the second amplifier is fed back to the second transistor to reduce the phase noise generated by the second transistor.

2. The Colpitts oscillator of claim 1, wherein:
a bulk of the first transistor is tied of a source of the first transistor; and
a bulk of the second transistor is tied of a source of the second transistor.

3. The Colpitts oscillator of claim 1, wherein the reference potential is ground.

4. The Colpitts oscillator of claim 3, wherein:
the first end of the first feedback capacitance is directly connected to the output of the first amplifier; and
the first end of the second feedback capacitance is directly connected to the output of the second amplifier.

5. The Colpitts oscillator of claim 1, wherein each of the first transistor and the second transistor comprises a metal oxide semiconductor transistor.

6. The Colpitts oscillator of claim 1, wherein each of the first transistor and the second transistor comprises a bipolar junction transistor.

7. The Colpitts oscillator of claim 1, further comprising a bias generator configured to bias each of the first transistor, the second transistor, and the LC tank circuit.

* * * * *